(12) United States Patent
Chang et al.

(10) Patent No.: US 8,183,905 B2
(45) Date of Patent: May 22, 2012

(54) CONFIGURABLE CLOCK SIGNAL GENERATOR

(75) Inventors: Yuyu Chang, Irvine, CA (US); Qiang Li, Irvine, CA (US); John Leete, Huntington Beach, CA (US); Hooman Darabi, Irvine, CA (US); Yiannis Kokolakis, Holargos (GR)

(73) Assignee: Broadcom Corporation, Irvine, CA (US)

( * ) Notice: Subject to any disclaimer, the term of this patent is extended or adjusted under 35 U.S.C. 154(b) by 260 days.

(21) Appl. No.: 12/539,495

(22) Filed: Aug. 11, 2009

(65) Prior Publication Data

US 2011/0018604 A1    Jan. 27, 2011

Related U.S. Application Data

(60) Provisional application No. 61/228,775, filed on Jul. 27, 2009.

(51) Int. Cl.
*G06F 1/04* (2006.01)
*H03K 3/00* (2006.01)

(52) U.S. Cl. .................... 327/291; 327/293; 327/294

(58) Field of Classification Search .................. 327/291, 327/293, 294
See application file for complete search history.

(56) References Cited

U.S. PATENT DOCUMENTS

| | | | | |
|---|---|---|---|---|
| 5,228,067 A | * | 7/1993 | Ito et al. | 377/114 |
| 5,446,767 A | * | 8/1995 | Nakagawa et al. | 375/376 |
| 2004/0090278 A1 | * | 5/2004 | Hamaguchi et al. | 331/74 |
| 2005/0146964 A1 | * | 7/2005 | Sako | 365/211 |
| 2005/0253644 A1 | * | 11/2005 | Crippa et al. | 327/541 |
| 2007/0205836 A1 | * | 9/2007 | Xu | 331/25 |
| 2008/0036536 A1 | * | 2/2008 | Khorramabadi | 330/252 |
| 2009/0146719 A1 | * | 6/2009 | Pernia et al. | 327/291 |
| 2010/0211372 A1 | * | 8/2010 | Troedsson | 703/13 |

* cited by examiner

*Primary Examiner* — Ryan Jager
(74) *Attorney, Agent, or Firm* — Sterne, Kessler, Goldstein & Fox PLLC

(57) ABSTRACT

A method to provide a low-power clock signal or a low-noise clock signal is described herein. It is determined whether a low-power mode or a low-noise mode is in use. A voltage reference input of a low-dropout voltage regulator (LDO) is switched to a low-power voltage reference for low-power mode and to a low-noise voltage reference for low-noise mode. The LDO provides a constant voltage output to a crystal oscillator. A clock signal is generated using the crystal oscillator. The clock signal is limited using a low-power limiter to generate a low-power output clock signal and/or is limited using a low-noise limiter to generate a low-noise clock signal. The low-power output clock signal or the low-noise output clock signal is selected using a mux.

20 Claims, 9 Drawing Sheets

CONFIGURABLE CLOCK SIGNAL GENERATOR

CROSS-REFERENCE TO RELATED APPLICATIONS

This application claims the benefit of U.S. Provisional Application No. 61/228,775 filed on Jul. 27, 2009, which is incorporated herein by reference in its entirety.

BACKGROUND OF THE INVENTION

1. Field of the Invention

The invention is generally related to systems for generating clock signals.

2. Background Art

Some computing devices, such as mobile computing devices, may have a limited battery power supply. Computing devices include but are not limited to, mobile phones, laptops, wristwatches, MP3 players etc.

Methods and systems are needed to conserve battery power in such computing devices.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

The present invention will now be described with reference to the accompanying drawings. In the drawings, like reference numbers may indicate identical or functionally similar elements.

DETAILED DESCRIPTION OF THE INVENTION

Certain circuits in a computing device, such as phase locked loops (PLLs) in radio frequency (RF) circuits typically require a low-noise clock signal. On the other hand, certain circuits such as MP3 players, video players and non-RF circuits may not require a low-noise clock and can function with a clock signal that has a lower power level and possibly a higher noise level. For example, in an "airplane mode" or "sleep mode" of a computing device, such as a cell phone, RF circuitry such as a cellular integrated circuit (IC) may be powered down, while other circuits, such as the non-RF circuits of an MP3 player or a video game, may still be functional. Battery power may be unnecessarily wasted by using a high-power/low-noise clock signal for such non-RF circuits. Embodiments of the invention presented herein fulfill the long felt need to conserve battery power when circuits requiring a low-noise clock signal are inactive, but other less noise-sensitive circuits are still active.

The inventors have identified bandgap voltage reference generators and limiter circuits of a clock signal generator as consuming the most amount of power in portable power supplies. Battery power can be conserved by using a low-power bandgap voltage reference generator and a low-power limiter in low-power mode. Accordingly, embodiments of the invention presented herein may determine when a device is in low-power mode or is using low-power applications and switch to one or both of a low-power bandgap voltage reference generator and a low-power limiter to conserve power. "Low-power" mode is defined herein as an environment where circuits that do not require a low-noise clock input, such as non-radio frequency circuits, are active and circuits that do require a low-noise clock input, such as radio frequency circuits, are not active. Furthermore, embodiments of the invention presented herein may determine whether a circuit requires a low-noise clock and switch to one or both of a low-noise bandgap voltage reference generator and a low-noise limiter. "Low-noise" mode is defined herein as an environment where circuits that require a low-noise clock input, such as radio frequency circuits, are active and circuits that do not require a low-noise clock input, such as non radio frequency circuits, are not active. It is to be noted that high power is typically required to generate a low-noise clock signal.

Figure 1:
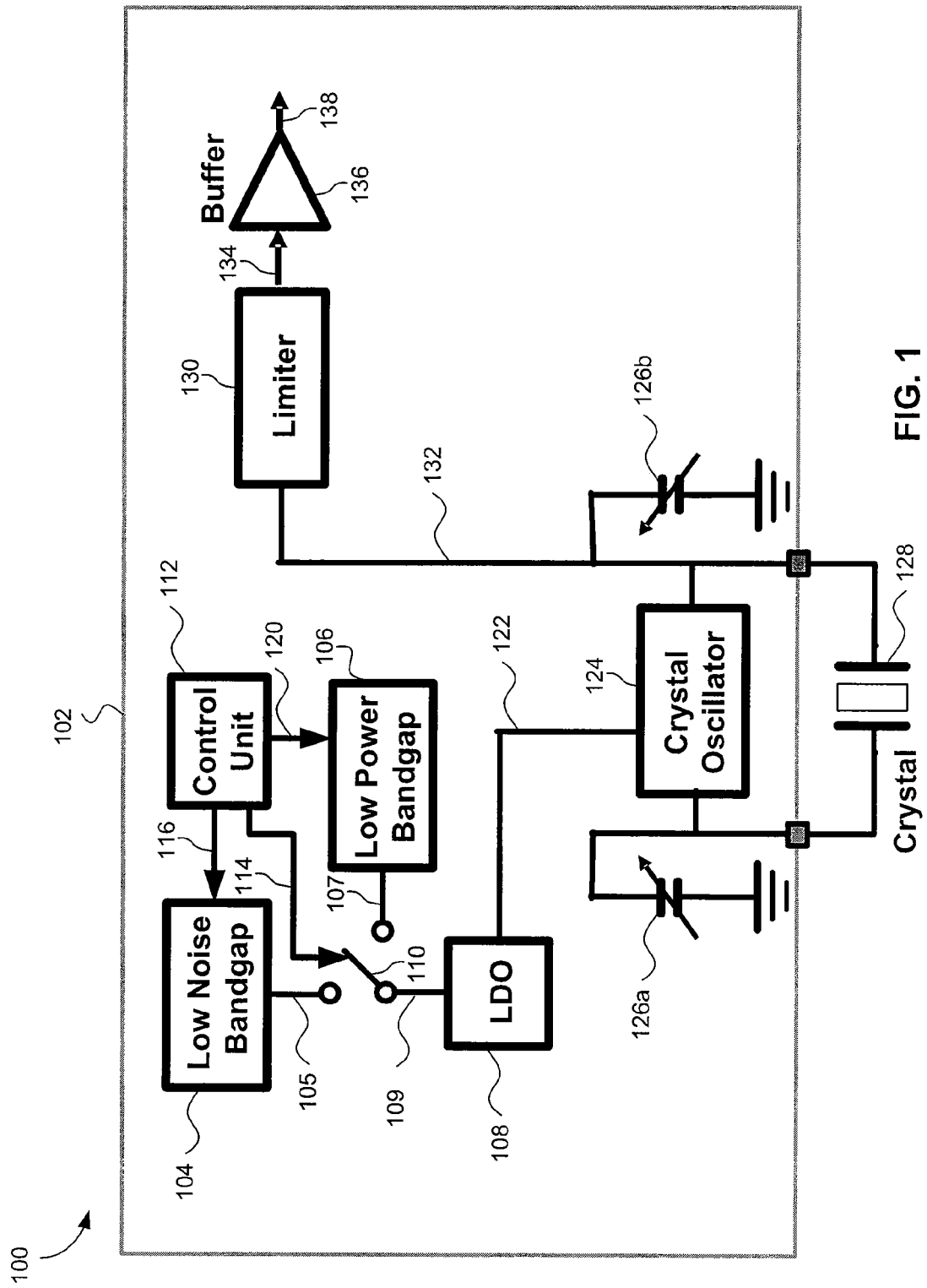
FIG. 1 illustrates an example system to generate a low-power clock signal or a low-noise clock signal according to an embodiment of the invention.

FIG. 1 illustrates an example system 100 to generate a low-power clock signal or a low-noise clock signal according to an embodiment of the invention.

Circuit 100 includes a low-noise bandgap voltage reference generator 104, a low-power bandgap voltage reference generator 106, a switch 110, control unit 112, a low-dropout voltage regulator (LDO), crystal oscillator 124, tuning capacitors 126a-b, crystal 128, limiter 130 and buffer 136. In an alternate embodiment switch 110 may be substituted with a mux. System 100 may be on a semiconductor chip 102. It is to be appreciated that some or all of the components of system 100 may be on or off chip 102. For example, crystal 128 is off chip 102 but may be on chip 102 in an alternate embodiment. Control unit 112 is on chip 102 in the present embodiment but may be off chip 102 in another embodiment.

Low-noise bandgap voltage reference generator 104 may generate a low-noise voltage reference signal 105. Low-power bandgap voltage reference generator 106 may generate a low-power voltage reference 107. An example circuit for a bandgap voltage reference generator according to an embodiment of the invention is described in further detail with reference to FIG. 2 below. Switch 110 may select between one of the low-noise bandgap voltage reference 105 or the low-power bandgap voltage reference 107 based on control signal 114 that may be generated by control unit 112. Switch 110 couples the selected voltage reference to voltage reference input 109 of low-dropout voltage regulator 108. Low-dropout voltage regulator 108 may provide a constant voltage output 122 to crystal oscillator 124. Crystal oscillator 124 may generate a clock signal 132 based on an output of crystal 128. The frequency of clock signal 132 may be tuned by using one or both of tuning capacitors 126a-b. Clock signal 132 may serve as an input to limiter circuit 130. Limiter circuit 130 voltage limits clock signal 132 to generate clock signal, 134 which is buffered by buffer 136 to generate an output clock signal 138.

Control signal 114 may be used to switch voltage reference input 109 of low-dropout regulator 108 to the low-noise bandgap voltage reference 105 for circuits that require a low-noise and/or high-power clock signal, such as radio frequency (RF) circuits. Control signal 114 may also used to switch the voltage reference input 109 of LDO 108 to the low-power bandgap voltage reference 107 for circuits that do not require a low-noise or high-power clock such as non-RF circuits. Selecting the low-noise bandgap voltage reference 105 from low-noise bandgap voltage generator 104 causes output clock signal 138 to be a low-noise output clock signal, but requires more battery power (i.e. low-noise mode). Selecting the low-power bandgap voltage reference 107 from low-power bandgap voltage reference 106 causes output clock signal 138 to be a low-power output clock signal, and results in power and battery savings compared to the low-noise mode.

In an embodiment, control unit 112 may also generate control signal 116 to power-down the low-noise bandgap voltage reference generator 104 and control signal 120 to power-up low-power bandgap voltage reference generator 106 (if it is inactive), upon switching the voltage reference input 109 of low-dropout regulator 108 to the low-power bandgap voltage reference 107 (i.e. low-power mode). Alternatively, control unit 112 may generate control signal 120 to power-down low-power bandgap voltage reference generator 106 and control signal 116 to power-up low-noise bandgap voltage reference generator 104 (if it is inactive) upon switching the voltage reference input 109 of the low-dropout regulator 108 to the low-noise bandgap voltage reference 104 (i.e. low-noise mode).

Figure 2:
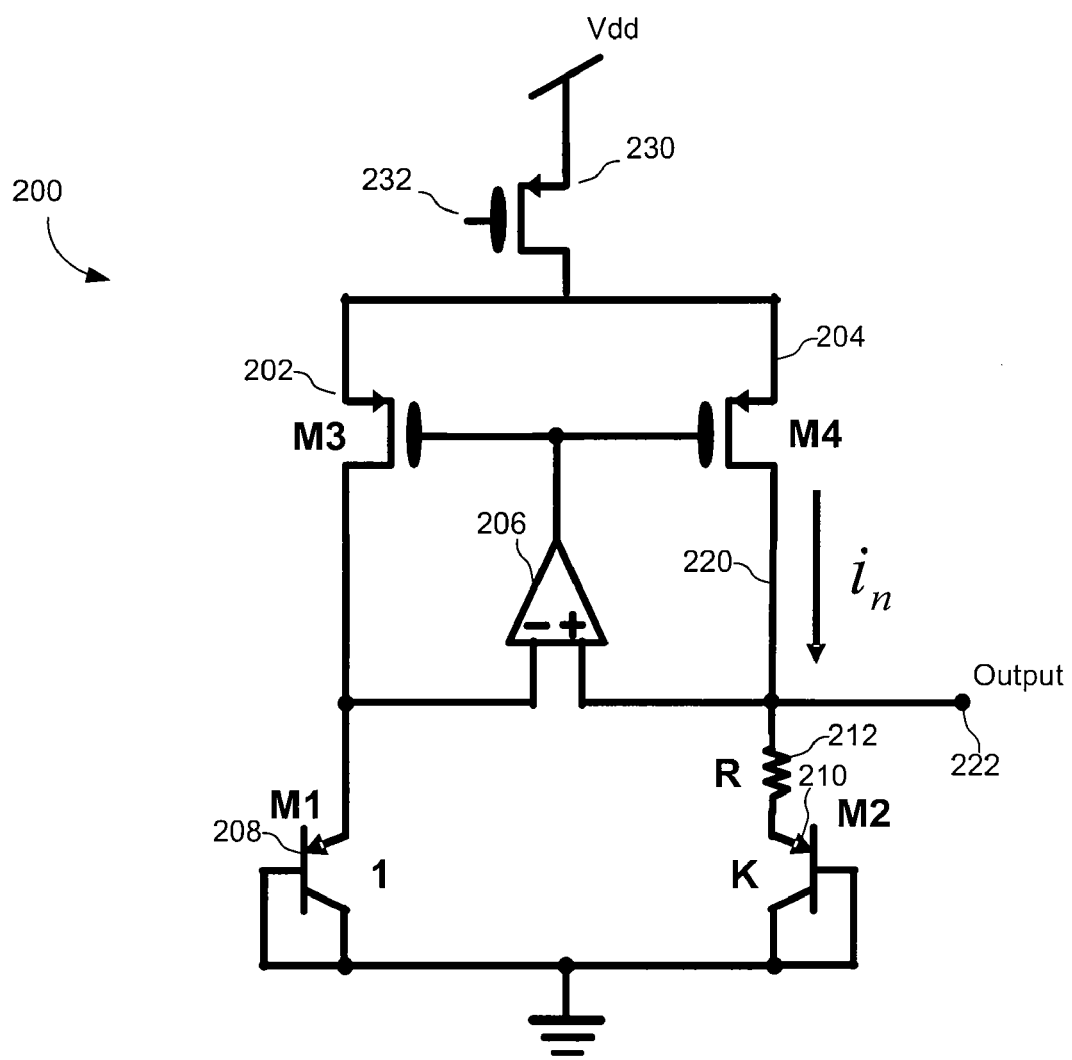
FIG. 2 illustrates an example bandgap voltage reference generator according to an embodiment of the invention.

FIG. 2 illustrates an example bandgap voltage reference generator 200 according to an embodiment of the invention.

Bandgap voltage reference generator 200 includes PNP (p-type emitter/collector and n-type base) transistors 208 and 210, p-FETs (p-type field effect transistors) 202 and 204 and n-FETs (n-type field effect transistors) 230. Bandgap voltage reference 200 also includes a comparator 206 and an emitter resistance 212. It is to be appreciated that the type of transistors used i.e. p-type or n-type is a design choice and may be arbitrary.

In an embodiment, power-up/down signal 232 may be used to turn transistor 230 on/off and thereby power-up or power-down bandgap voltage reference generator 200. In an example, signal 232 may be one of signals 116 or 120 that are used to power-up or power-down bandgap voltage reference generator 200.

A noise factor of bandgap voltage reference generator 200 may be based on bandgap noise current $i_n$ 220 and flicker noise voltage $V_n$ of the transistors. Methods to reduce bandgap noise current $i_n$ 220 and flicker noise voltage $V_n$ for low-noise mode of operation are described below.

Flicker noise voltage $V_n$ may be given by equation 1 below:

$$\overline{V_n^2} = \frac{N}{C_{ox}WL}\frac{1}{f} \qquad \text{equation 1}$$

In equation 1 above, N is a process dependent constant;
$C_{ox}$, is the gate-oxide capacitance per unit area;
W is the width of the transistor;
L is the length of the transistor; and
f is the frequency of operation.

The area of a transistor is based on W and L. A larger value of W and L results in a reduced flicker noise voltage $V_n$. By increasing W and/or L and thereby the area of a transistor, flicker noise voltage $V_n$ can be reduced.

Bandgap noise current $i_n$ 220 is given by equation 2 below:

$$\hat{i_n^2} = \frac{4KTR}{\left(\frac{K-1}{gm}+R\right)^2} \approx \frac{4KTR}{\left(\frac{K-1}{gm}\right)^2} \qquad \text{equation 2}$$

In equation 2 above, K is the ratio of the area of transistor 210 to transistor 208;
T is the temperature of the transistor;
R is the emitter resistance 212; and
gm is a transconductance factor of a transistor.

A smaller value of resistance R 212 results in a reduced bandgap noise current $i_n$ 220. Therefore, in low-noise mode bandgap noise current $i_n$ 220 can be reduced by decreasing resistance R 212.

In an embodiment, low-noise bandgap voltage reference generator 104 and low-power bandgap voltage reference generator 106 may have similar circuits as bandgap voltage reference 200 but have differing values of emitter resistance R and differing area (W and L values) of transistors. For example, in an embodiment, low-noise bandgap voltage reference generator 104 may have a smaller value for emitter resistance 212 than a low-power bandgap voltage reference generator 106. The smaller value of resistance 212 decreases noise in an output of low-noise bandgap voltage reference generator 104 by reducing bandgap noise current $i_n$ 220. In contrast, the larger value for emitter resistance 212 in low-power bandgap voltage reference generator 106 generates a low-power output voltage reference 107 but may also increase noise in the output voltage reference 107 by increasing bandgap noise current $i_n$ 220.

In a further embodiment, in addition to, or in the alternative of, differing values of resistance 212, low-noise bandgap voltage generator 104 and low-power bandgap voltage regulator 106 may differ in the area of transistors, for example area of transistors 210 and 208. For example, transistors in a low-noise bandgap voltage generator 104 may have a larger area (W and L) than transistors in low-power bandgap voltage generator 106. As described above, a larger area of transistors may result in reduced flicker noise voltage $V_n$, but requires larger current and thus more power (i.e. low-noise mode). In contrast, the smaller area of transistors in low-power bandgap voltage reference generator 106, requires less bias current and therefore less power (i.e. low-power mode), but may also increase noise in the output voltage reference 107 due to increased flicker noise voltage $V_n$.

Figure 3:
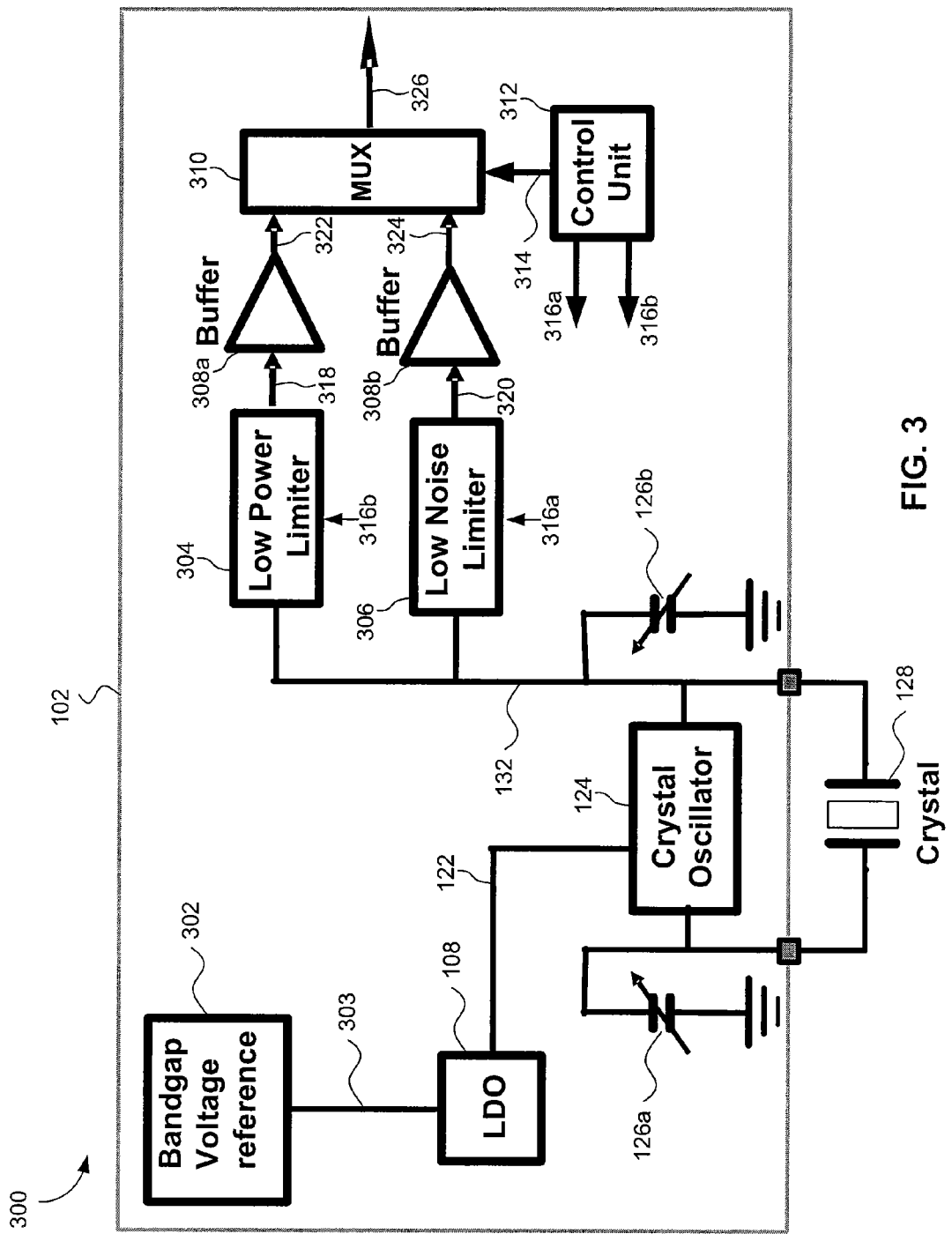
FIG. 3 illustrates an example system to generate a low-power clock signal or a low-noise clock signal according to an embodiment of the invention.

FIG. 3 illustrates an example system 300 to generate a low-power clock signal or a low-noise clock signal according to an embodiment of the invention. Circuit 300 includes a bandgap voltage reference generator 302, a low-dropout voltage regulator 108, a crystal oscillator 124, tuning capacitors 126a-b, crystal 128, a low-power limiter 304, a low-noise limiter 306, buffers 308a-b, mux 310 and control unit 312. In an alternate embodiment, mux 310 may be substituted with a switch. It is to be appreciated that part or all of system 300 may be implemented on or off chip 102. For example, circuit 300 may be implemented on chip 102. Control unit 312 may be located off chip 102 or on chip 102.

Bandgap voltage reference generator 302 provides a voltage reference signal 303 to low-dropout voltage regulator 108. Low-dropout voltage regulator 108 may provide a constant voltage signal 122 to crystal oscillator 124. Crystal oscillator 124 may provide a clock signal 132 to low-power limiter 304 and low-noise limiter 306. Low-power limiter 304 may limit clock signal 132 to generate low-power clock signal output 318. Low-noise limiter 306 may limit clock signal 132 to generate low-noise clock signal 320. An example limiter circuit is described below with reference to FIG. 4. Buffers 308a and 308b buffer the low-power clock signal 318 and low-noise clock signal 320 respectively to generate low-power output clock signal 322 and low-noise output clock signal 324. Mux 310 selects one of low-power output clock signal 322 and low-noise output clock signal 324 to be output clock signal 326 based on control signal 314 that may be generated by control unit 312. For example, control signal 314 may be used to select low-power output clock signal 322 for circuits that may be able to function with a low-power, and possibly higher noise, clock signal such as non-RF circuits (i.e. low-power mode). Alternatively, control signal 314 may be used to select low-noise output clock signal 324 for circuits that may require a low-noise clock signal such as RF circuits (i.e. low-noise mode).

In an embodiment, control unit 312 may generate a first control signal 316a to power-down low-noise limiter 306 and a control signal 316b to power-up low-power limiter 304 (if it is inactive) if control signal 314 selects low-power output clock signal 322 for low-power mode of operation. Control unit 312 may also generate control signal 316b to power-down low-power limiter 304 and control signal 316a to power-up low-noise limiter 316a (if it is inactive) if control signal 314 selects low-noise output clock signal 324 for low-noise mode of operation.

Figure 4:
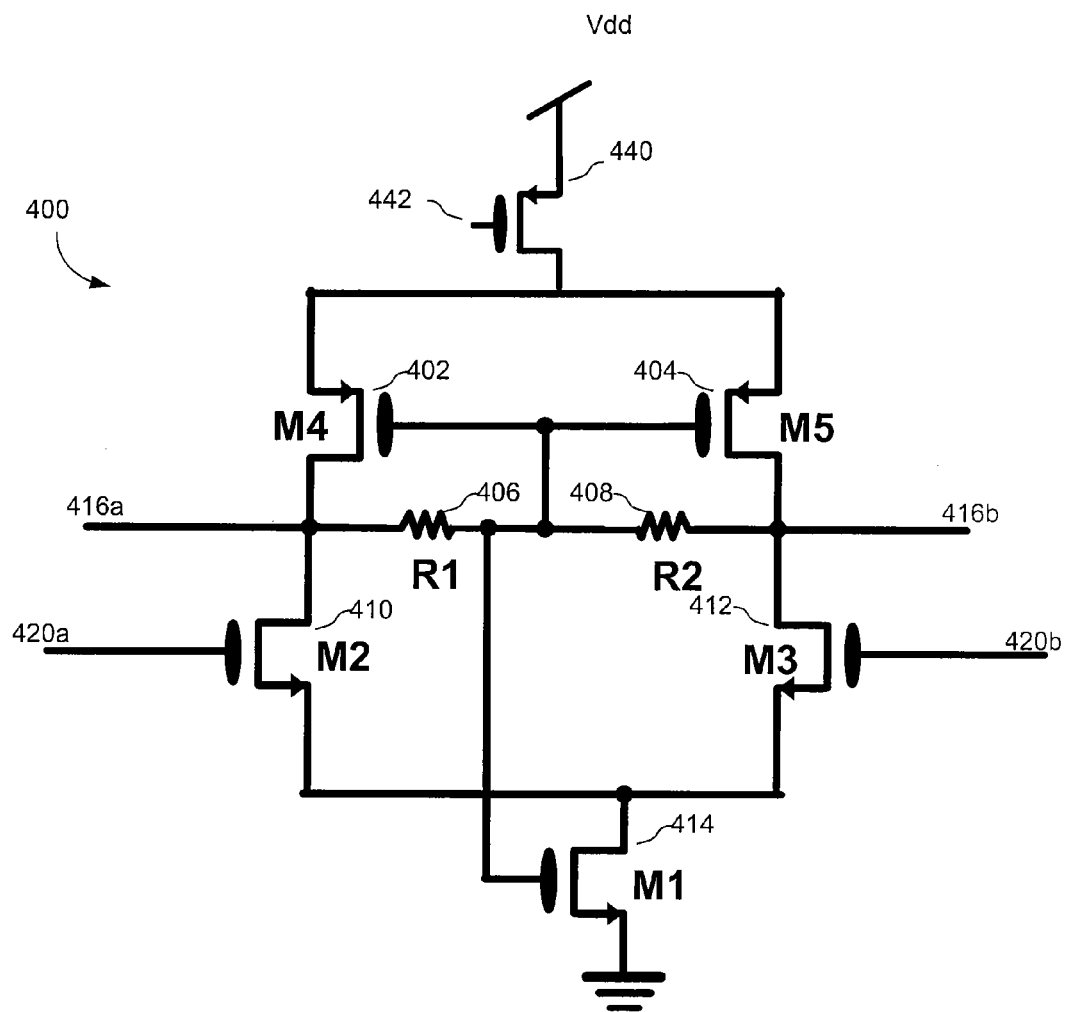
FIG. 4 illustrates an example limiter according to an embodiment of the invention.

FIG. 4 illustrates an example limiter 400 according to an embodiment of the invention. Limiter 400 may include resistors 406 and 408. Limiter 400 may also include p-FETs (p-type field effect transistors) 402, 404 and 440 and n-FETs (n-type field effect transistors) 410, 412 and 414. It is to be appreciated that the type of transistor used, i.e. a p-type or a n-type transistor, is a design choice and may vary.

Limiter 400 may be a differential limiter with differential inputs 420a-b and differential outputs 416a-b. In an example, limiter 400 may be used to convert an analog sine wave clock signal input 132 from crystal oscillator 124 into a digital square wave clock output.

Using a large bias current for transistors in limiter 400 may result in faster switching times and thereby better noise performance. Limiting a clock signal, for example clock signal 132, using a low bias current may result in a low-power output clock signal. In an example, strength of a bias current may be based on the size of transistor 402, 404 and 414. For example, larger transistor sizes for transistors 402, 404 and 414 may lead to larger bias currents, faster switching time and lower noise. Furthermore, larger transistor sizes may also result in reduced flicker noise as described above with reference to equation 1. For low-power applications a bias current for transistors may be reduced resulting in a low-power output. Bias current may be reduced by reducing the size of one or more transistors, for example transistors 402, 404 and 414, in limiter 400. In an embodiment, power-up/down signal 442 may be used to turn transistor 440 on/off and thereby power-up or power-down limiter 400. In an example, signal 442 may be one of signals 316a or 316b. It is noted that the transistor size/power relationship described above applies to the bandgap voltage reference generator in FIG. 2 as well.

In an embodiment, low-noise limiter 306 may employ a large bias current resulting in faster switching time for its transistors and lower output noise. Limiting a clock signal, for example clock signal 132, using a high bias current may result in a high-power output clock signal. In an embodiment, a large bias current may be obtained in limiter 306 by increasing the size of transistors 402, 404 and 414. The large transistor sizes may also result in reduced flicker noise.

In an embodiment, low-power limiter 304 may reduce power consumption by reducing bias current for transistors in limiter 400. Bias current may be reduced by reducing the size of transistors 404 and 414. The reduced transistor size may result in reduced bias current and lower power consumption but may also result in increased flicker noise.

Figure 5:
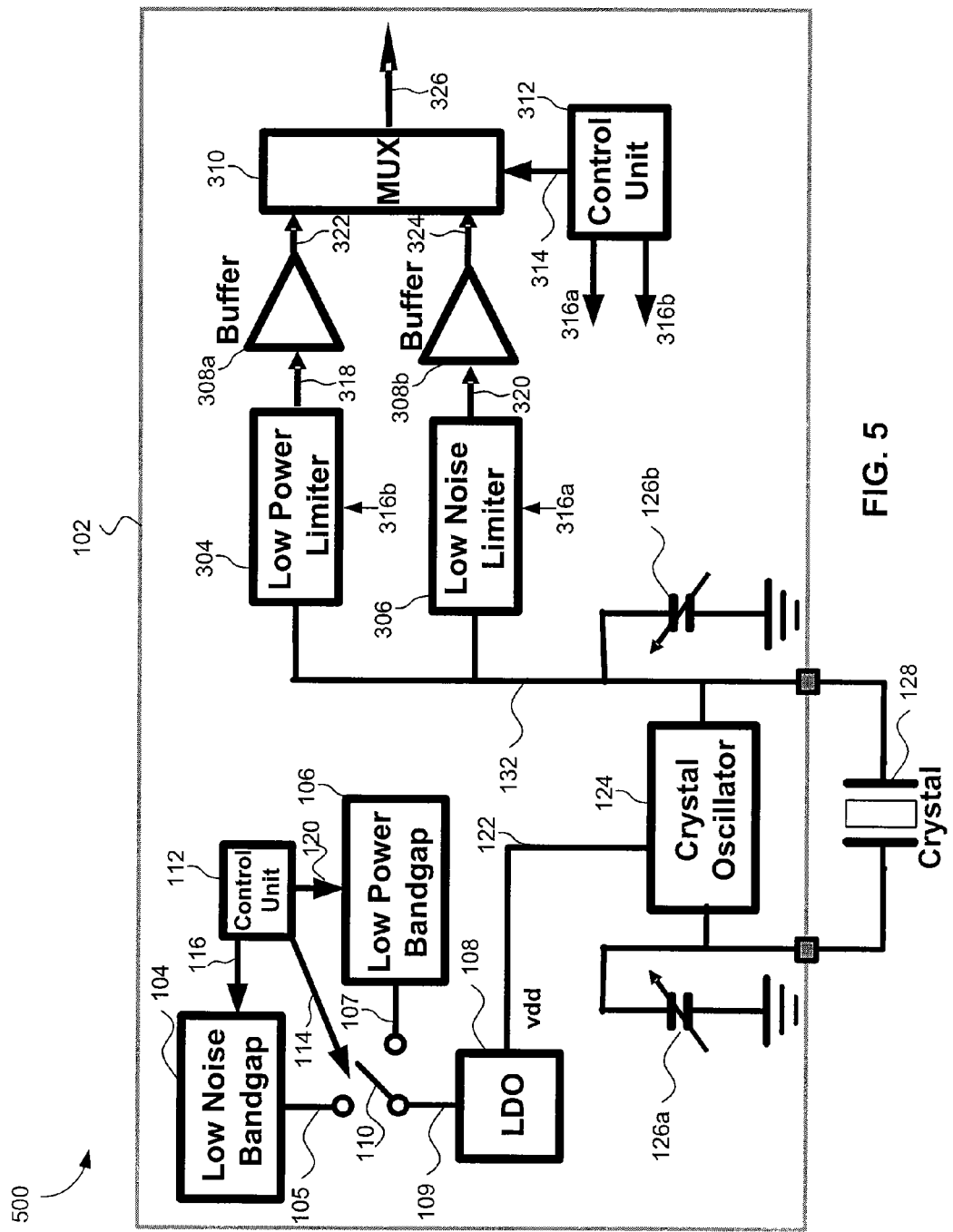
FIG. 5 illustrates an example system to generate a low-power clock signal or a low-noise clock signal according to an embodiment of the invention.

FIG. 5 illustrates an example system 500 to generate a low-power clock signal or a low-noise clock signal according to an embodiment of the invention.

System 500 includes low-noise bandgap voltage reference generator 104, low-power bandgap voltage reference generator 106, control unit 112, low-dropout voltage regulator 108, crystal oscillator 124, tuning capacitors 126a-b, crystal 128, low-power limiter 304, low-noise limiter 306, buffers 308a-b, mux 310 and control unit 312. It is to be appreciated that some or all of components of system 500 may be implemented on or off chip 102.

In an embodiment, control unit 112 may initiate (based on internal or external input e.g. user input/selection) low-power mode and generate control signal 114 that may cause switch 110 to switch voltage reference input 109 to low-power bandgap voltage reference signal 107. In an embodiment, control unit 112 may also generate control signal 116 to power-down low-noise bandgap voltage generator 104 and control signal 120 to power-up low-power bandgap voltage reference 106 in the event that low-power bandgap voltage reference generator 106 was powered-down. Further, in low-power mode, control unit 312 may generate control signal 314 that may cause mux 310 to select low-power output clock signal 322 as output clock signal 326. In an embodiment, upon determining low-power mode, control unit 312 may generate control signal 316a to power-down low-noise limiter 306 and control signal 316b to power-up low-power limiter 304 in the event that low-power limiter 304 was powered-down.

In an embodiment, control unit 112 may initiate low-noise mode and generate control signal 114 that may cause switch 110 to switch voltage reference input 109 to low-noise bandgap voltage reference 105. In low-noise mode, control unit 112 may also generate signal 120 to power-down low-power bandgap voltage reference 106 and may also generate control signal 116 to power-up low-noise bandgap voltage reference 104 in the event that low-noise bandgap voltage reference 104 was powered-down. In low-noise mode, control unit 312 may generate control signal 314 that causes mux 310 to select low-noise output clock signal 324 to be output clock signal 326. Upon determining low-noise mode, control unit 312 may also generate control signal 316b to power-down low-power limiter 304 and control signal 316a to power-up low-noise limiter 306 in the event that low-noise limiter 306 is powered-down.

It is to be appreciated that control unit 112 and control unit 312 may be on chip 102 or off chip 102. In an embodiment, control unit 112 and control unit 312 may be a combined into a single control unit that may generate control signals 114, 116, 120, 314, 316a and 316b in addition to determining low-power mode or low-noise mode. In an embodiment, control unit 112 and control unit 312 may determine low-power mode or high power mode upon receiving input from, for example, a user that selects low-power mode (such as silent mode or airplane mode) on a computing device (such as a cell phone).

Figure 6:
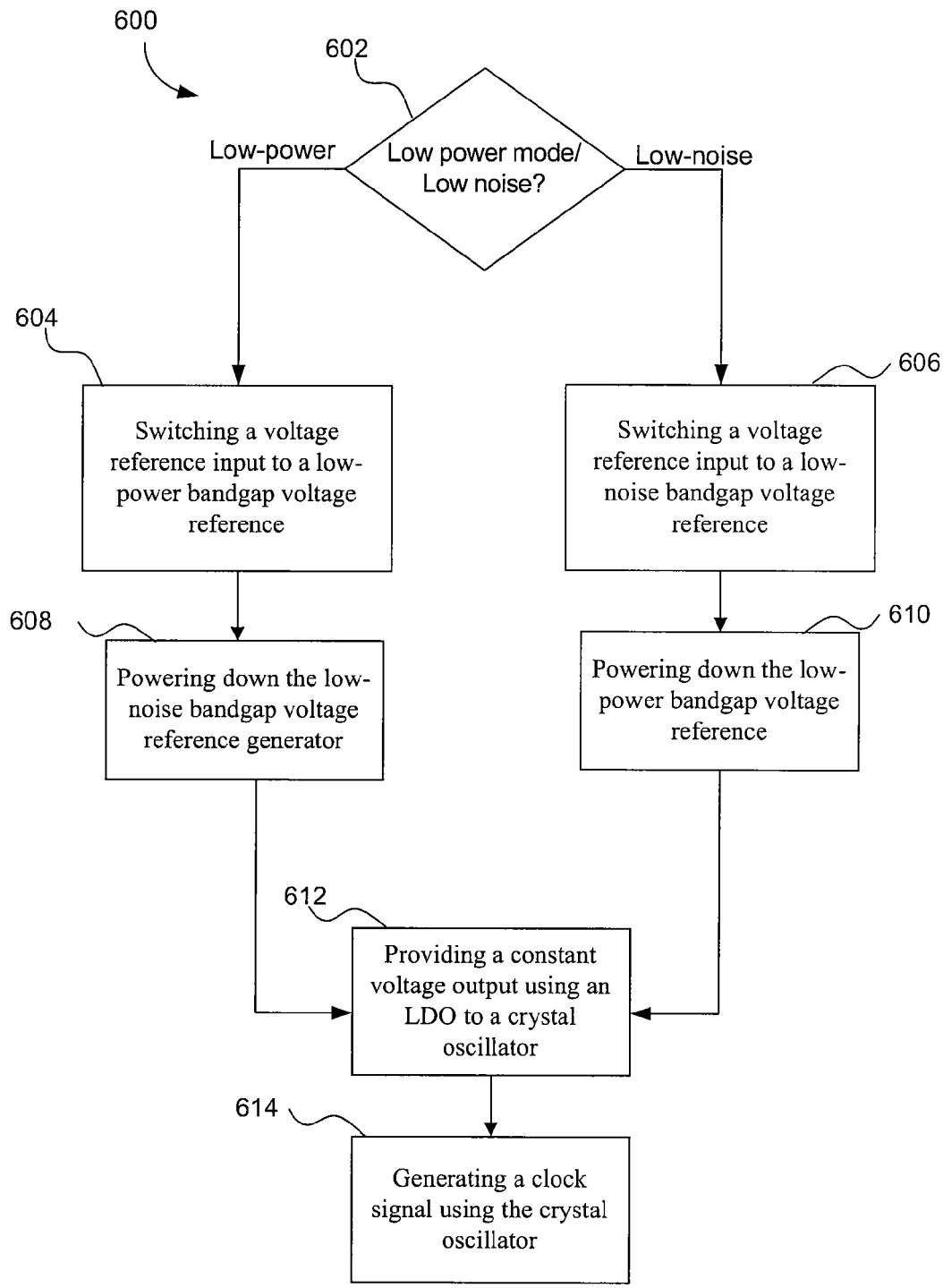
FIG. 6 illustrates an example flow chart of a method to generate a low-power or a low-noise clock signal according to an embodiment of the invention.

FIG. 6 illustrates an example flow chart 600 illustrating steps to generate a low-power or a low-noise clock signal according to an embodiment of the invention. Flow chart 600 will be described with continued reference to the example operating environment depicted in FIGS. 1-5. However, flow chart 600 is not limited to theses embodiments. Note that some steps shown in flow chart 600 do not necessarily have to occur in the order shown.

In step 602, it is determined whether a low-power clock or a low-noise clock is required. If it is determined that a clock is required for low-power mode of operation, then control proceeds to step 604. If it is determined that a clock is required for low-noise mode of operation, then control proceeds to step 606. For example, control unit 112 may determine whether a low-power clock or a low-noise clock is required.

In step 604, a voltage reference input is switched to a low-power bandgap voltage reference. For example, control unit 112 may generate signal 114 that causes switch 110 to switch voltage reference input 109 of low-dropout voltage regulator 108 to low-power bandgap voltage reference 107. In the event that low-power bandgap voltage reference generator 106 is powered-down, control unit 120 may also generate signal 120 to power-up low-power bandgap voltage reference generator 106.

In step 608, the low-noise bandgap voltage reference generator is powered down. For example, control unit 112 may generate a control signal 116 to power-down low-noise bandgap voltage reference generator 104.

In step 606, a voltage reference input is switched to a low-noise bandgap voltage reference. For example, control unit 112 may generate signal 114 that causes switch 110 to switch the voltage reference input 109 to low-noise bandgap voltage reference 105. In the event that low-noise bandgap voltage reference 104 is inactive or powered-down control unit 112 may provide signal 116 to activate low-noise bandgap voltage reference generator 104.

In step 610, the low-power bandgap voltage reference is powered down. For example, in the event that low-power bandgap voltage reference 106 is active, control unit 112 generates signal 120 to power-down low-power bandgap voltage reference 106.

In step 612, a constant voltage output is provided by the low-dropout voltage regulator to a crystal oscillator. For example, low dropout voltage regulator 108 provides a constant voltage output 122 to crystal oscillator circuit 124.

In step 614, the crystal oscillator generates a clock signal that may be limited by a limiter circuit and buffered to generate an output clock signal. For example, crystal oscillator 124 may generate an clock signal 132 which is limited by limiter 130 to generate limited clock signal 134 that is buffered by buffer 136 to generate output clock signal 138.

Figure 7:
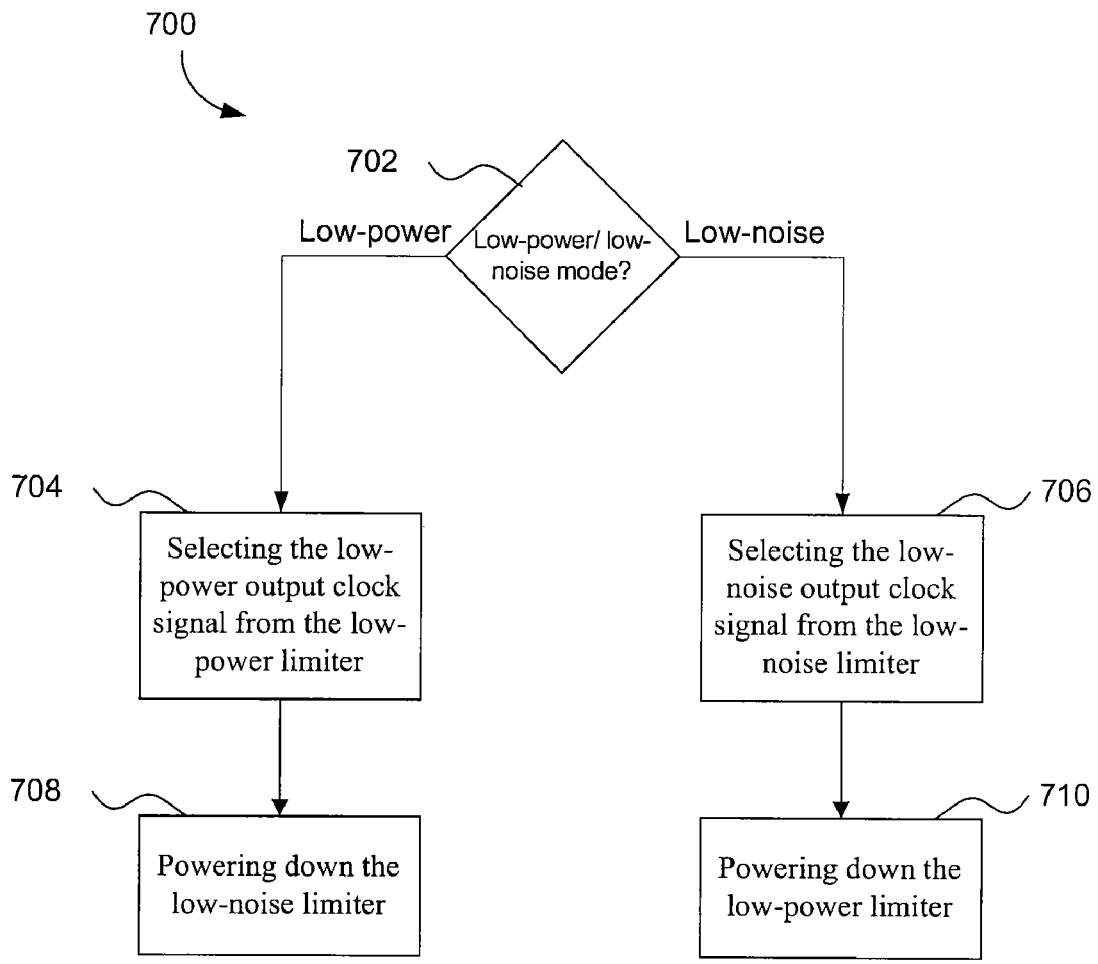
FIG. 7 illustrates an example flow chart of a method to generate a low-power or a low-noise clock signal according to an embodiment of the invention.

FIG. 7 illustrates an example flow chart 700 illustrating steps performed to generate a low-power clock signal or a low-noise clock signal according to an embodiment of the invention. Flow chart 700 will be described with continued reference to the example operating environment depicted in FIGS. 1-5. However, flow chart 700 is not limited to these embodiments. Note that some of the steps shown in flow chart 700 do not necessarily have to occur in the order shown.

In step 702, it is determined whether a low-power clock or a low-noise clock is required. For example, control unit 312 determines whether a low-power clock or a low-noise clock is required. If a low-power clock is required, then control proceeds to step 704. If a low-noise clock is required, then control proceeds to step 706.

In step 704, a low-power output clock is selected. For example, control unit 312 selects low-power clock 322 by providing signal 314 to mux 310. In the event that low-power limiter 304 is inactive, control unit 312 may provide control signal 316b to power-up low-power limiter 304.

In step 708, a low-noise limiter is powered down. For example, control unit 312 generates control signal 316a to power down low-noise limiter 306.

In step 706, a low-noise output clock signal is selected. For example, control unit 312 provides signal 314 to mux 310 to select low-noise clock signal 324. In the event that low-noise limiter 306 is inactive, control unit 312 may also provide control signal 316a to activate or power-up low-noise limiter 306.

In step 710, the low-power limiter is powered down. For example, control unit 312 provides control signal 316b to power down the low-power limiter 304.

Figure 8:
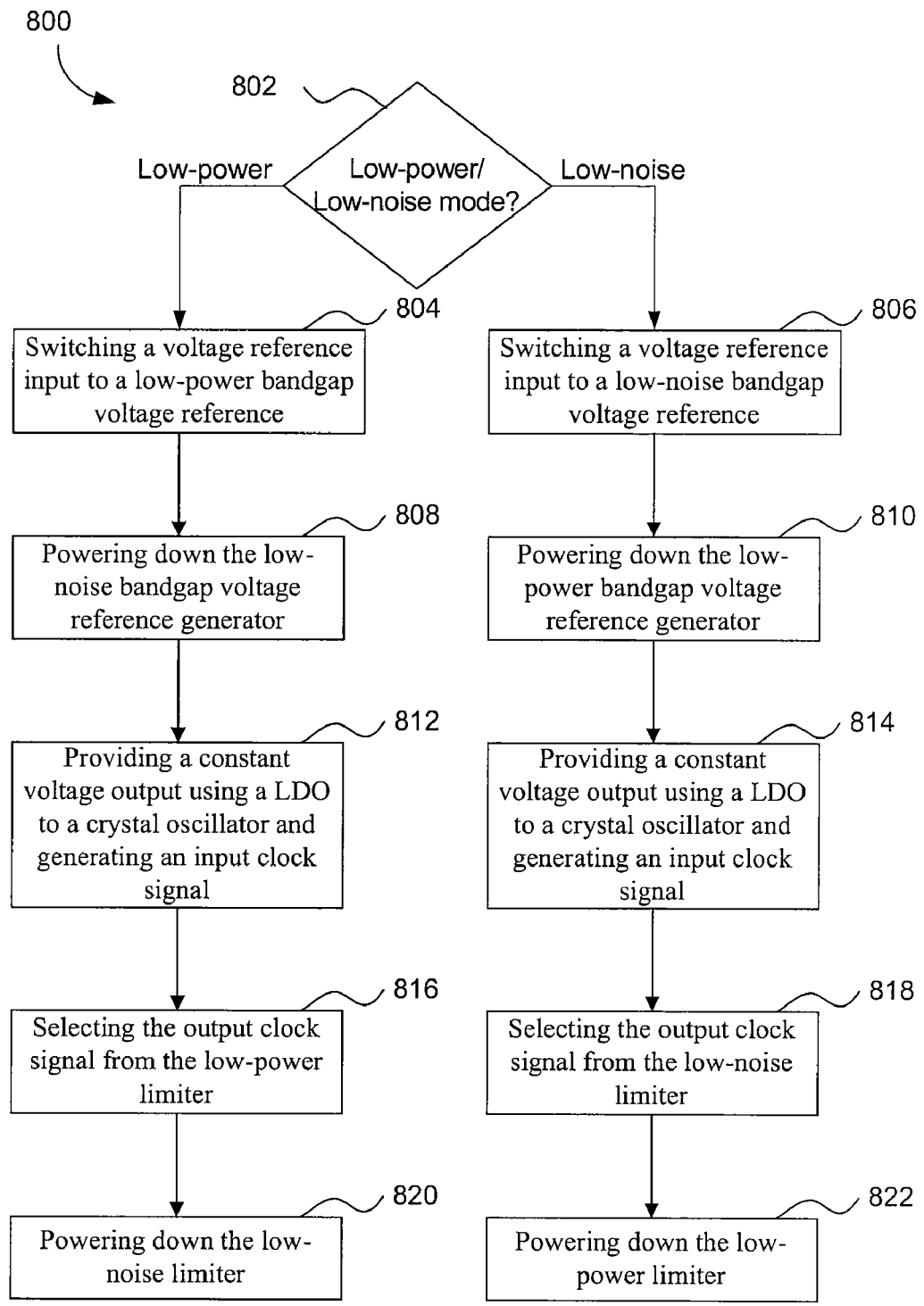
FIG. 8 illustrates an example flow chart of a method to generate a low-power or a low-noise clock signal according to an embodiment of the invention.

FIG. 8 illustrates an example flow chart 800 illustrating steps performed to provide a low-power or a low-noise clock signal according to an embodiment of the invention. Flow chart 800 will be described with continued reference to the example operating environment depicted in FIGS. 1-5. However, flow chart 800 is not limited to these embodiments. Note that some of the steps shown in flow chart 800 do not necessarily have to occur in the order shown, and one or more could occur simultaneously.

In step 802, it is determined whether a low-power clock or a low-noise clock is required. For example, control unit 112 and/or control unit 312 may determine whether a low-power clock or a low-noise clock is required. If it is determined that a low-power clock is required, then control proceeds to step 804. If it is determined that a low-noise clock is required, then control proceeds to step 806.

In step 804, a voltage reference input of a low-dropout voltage regulator is switched to a low-power bandgap voltage reference. For example, control unit 112 provides control signal 114 to switch 110 to switch voltage reference input 109 of low dropout voltage regulator 108 to low-power voltage reference 107. In the event that low-power bandgap voltage reference generator 106 is inactive or powered-down, control unit 112 may provide signal 120 to power-up low-power bandgap voltage regulator 106.

In step 808, the low-noise bandgap voltage reference generator is powered down. For example, control unit 112 may provide control signal 116 to power down low-noise bandgap voltage reference generator 104.

In step 812, a constant voltage output is provided, using the low-dropout voltage regulator, to a crystal oscillator which generates a clock signal that is provided to a low-power limiter. The low-power limiter limits the clock signal to generate a limited clock signal that is buffered to generate a low-power output clock signal. For example, low-dropout voltage regulator 108 provides a constant voltage 122 to crystal oscillator 124 that generates clock signal 132 that is limited by low-power limiter 304 to generate low-power clock signal 318, which is buffered by buffer 308a to generate low-power output clock signal 322. In the event that low-power limiter 304 is inactive, control unit 312 may also generate control signal 316b to activate low-power limiter 304.

In step 816, a low-power output clock signal is selected. For example, control unit 312 provides a control signal 314 to mux 310 that selects low-power output clock signal 322.

In step 820, the low-noise limiter is deactivated or powered down. For example, control unit 312 generates control signal 316a to power-down low-noise limiter 306.

In step 806, a voltage reference input of a low dropout voltage regulator is switched to a low-noise bandgap voltage reference. For example, control unit 112 generates control signal 114 that causes switch 110 to switch voltage reference 109 of low-dropout voltage regulator 108 to low-noise bandgap voltage reference 105. In the event that low-noise bandgap voltage reference generator 104 is inactive, control unit 112 may generate control signal 116 to activate low-noise bandgap voltage reference generator 104.

In step 810, the low-power bandgap voltage reference generator is powered down. For example, control unit 112 generates control signal 120 to power down low-power bandgap voltage reference generator 106.

In step 814, a constant voltage is provided by the low-dropout voltage regulator to crystal oscillator which generates a clock signal input that is limited by a low-noise limiter to generate a low-noise clock signal. Low-noise clock signal 320 may be buffered by buffer 308b to generate low-noise output clock signal 324. For example, low-dropout voltage regulator 108 generates a constant voltage reference 122 that is provided to crystal oscillator 124 that generates an input clock signal 132 that is limited by low-noise limiter 306 to generate low-noise clock signal 320. Low-noise clock signal 320 is buffered by buffer 308b to generate low-noise output clock signal 324. In the event that low-noise limiter 306 is inactive, control unit 312 may generate control signal 316 to power up low-noise limiter 306.

In step 818, low-noise output clock signal is selected. For example, control unit 312 generates control signal 314 that causes mux 310 to select low-noise output clock 324.

In step 822, the low-power limiter is powered down. For example, control unit 312 generates control signal 316b to power-down low-power limiter 304.

The present invention, or portions thereof, can be implemented in hardware, firmware, software, and/or combinations thereof.

Figure 9:
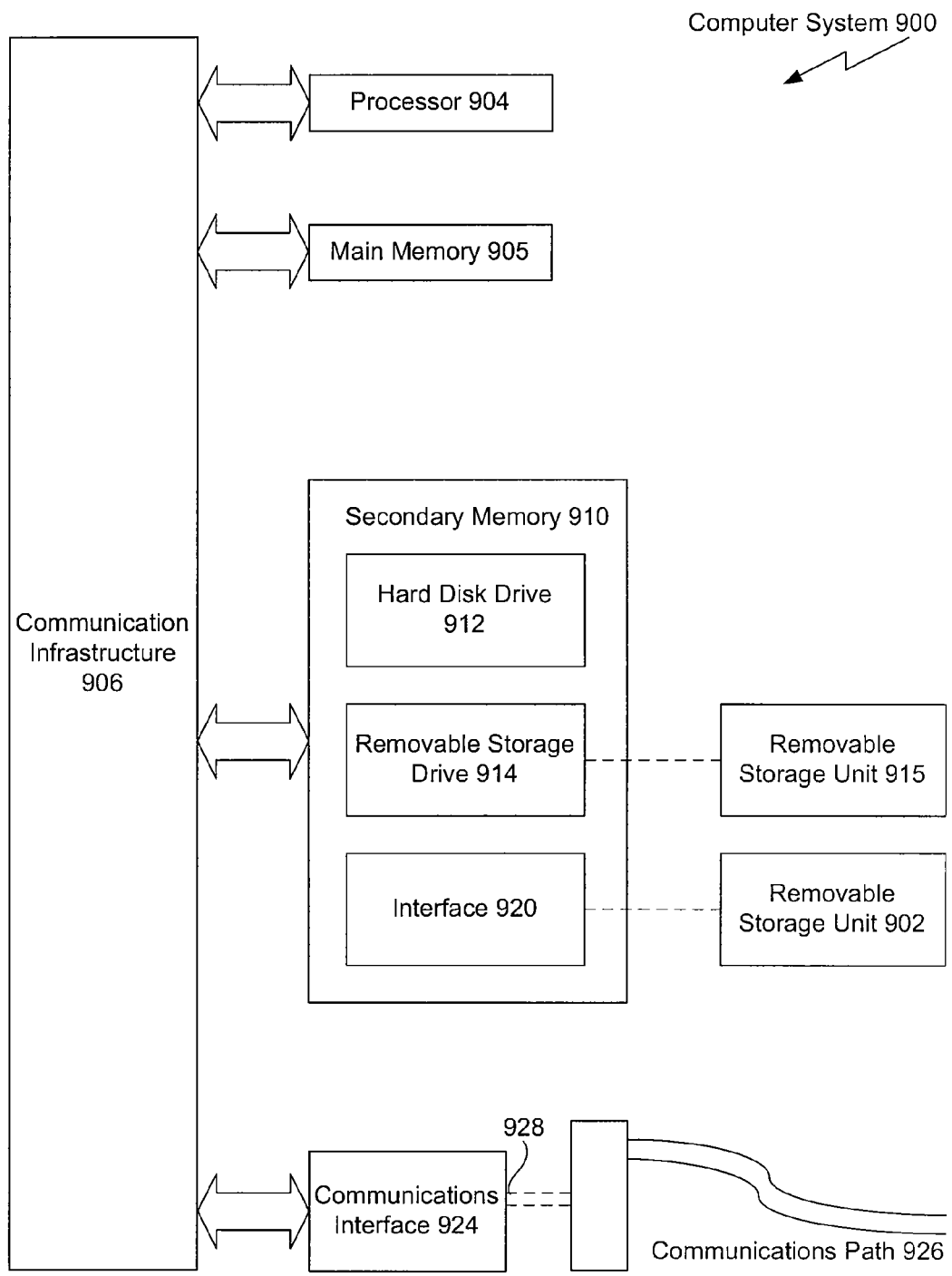
FIG. 9 is a block diagram of an exemplary computer system on which the present invention can be implemented.

The following description of a general purpose computer system is provided for completeness. The present invention can be implemented in hardware, or as a combination of software and hardware. Consequently, the invention may be implemented in the environment of a computer system or other processing system. An example of such a computer system 900 is shown in FIG. 9. The computer system 900 includes one or more processors, such as processor 904. Processor 904 can be a special purpose or a general purpose digital signal processor. The processor 904 is connected to a communication infrastructure 906 (for example, a bus or network). Various software implementations are described in terms of this exemplary computer system. After reading this description, it will become apparent to a person skilled in the relevant art how to implement the invention using other computer systems and/or computer architectures.

Computer system 900 also includes a main memory 905, preferably random access memory (RAM), and may also include a secondary memory 901. The secondary memory 901 may include, for example, a hard disk drive 912, and/or a removable storage drive 914, representing a floppy disk drive, a magnetic tape drive, an optical disk drive, etc. The removable storage drive 914 reads from and/or writes to a removable storage unit 915 in a well known manner. Removable storage unit 915, represents a floppy disk, magnetic tape, optical disk, etc. As will be appreciated, the removable storage unit 915 includes a computer usable storage medium having stored therein computer software and/or data.

In alternative implementations, secondary memory 910 may include other similar means for allowing computer programs or other instructions to be loaded into computer system 900. Such means may include, for example, a removable storage unit 902 and an interface 920. Examples of such means may include a program cartridge and cartridge interface (such as that found in video game devices), a removable memory chip (such as an EPROM, or PROM) and associated socket, and other removable storage units 902 and interfaces 920 which allow software and data to be transferred from the removable storage unit 902 to computer system 900.

Computer system 900 may also include a communications interface 924. Communications interface 924 allows software and data to be transferred between computer system 900 and external devices. Examples of communications interface 924 may include a modem, a network interface (such as an Ethernet card), a communications port, a PCMCIA slot and card, etc. Software and data transferred via communications interface 924 are in the form of signals 928 which may be electronic, electromagnetic, optical or other signals capable of being received by communications interface 924. These signals 928 are provided to communications interface 924 via a communications path 926. Communications path 926 carries signals 928 and may be implemented using wire or cable, fiber optics, a phone line, a cellular phone link, an RF link and other communications channels.

The terms "computer program medium" and "computer usable medium" are used herein to generally refer to media such as removable storage drive 914, a hard disk installed in hard disk drive 912, and signals 928. These computer program products are means for providing software to computer system 900.

Computer programs (also called computer control logic) are stored in main memory 905 and/or secondary memory 910. Computer programs may also be received via communications interface 924. Such computer programs, when executed, enable the computer system 900 to implement the present invention as discussed herein. In particular, the computer programs, when executed, enable the processor 904 to implement the processes of the present invention. Where the invention is implemented using software, the software may be stored in a computer program product and loaded into computer system 900 using removable storage drive 914, hard drive 912 or communications interface 924.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A system to provide a low-power clock signal or a low-noise clock signal, comprising:

a low-dropout voltage regulator (LDO);

a low-power bandgap voltage reference generator coupled to the LDO and configured to provide a low-power voltage reference to the LDO;

a low-noise bandgap voltage reference generator coupled to the LDO and configured to provide a low-noise voltage reference to the LDO;

a switch configured to switch a voltage reference input of the LDO to the low-noise bandgap voltage reference or to the low-power bandgap voltage reference; and a crystal oscillator coupled to the LDO and configured to provide a low-power clock signal or a low-noise clock signal based on whether a low-noise voltage reference or a low-power voltage reference is selected as a voltage reference input to the LDO.

2. The system of claim 1, further comprising:
a control unit configured to provide a control signal to switch the voltage reference input of the LDO to the low-noise bandgap voltage reference for low-noise mode of operation and to switch the voltage reference input of the LDO to the low-power bandgap voltage reference for low-power mode of operation.

3. The system of claim 2, wherein the control unit generates a signal to power down the low-noise bandgap voltage reference generator upon switching the voltage reference input of the LDO to the low-power bandgap voltage reference and to power down the low-power bandgap voltage reference generator upon switching the voltage reference input of the LDO to the low-noise bandgap voltage reference.

4. The system of claim 1, wherein a bandgap noise current of the low-power bandgap voltage reference generator is smaller than a bandgap noise current of the low-noise bandgap voltage reference generator.

5. The system of claim 1, wherein an emitter resistance of the low-noise bandgap voltage reference generator is smaller than an emitter resistance of the low-power bandgap voltage reference generator.

6. The system of claim 1, wherein transistor sizes of the low-noise bandgap voltage reference generator are greater than transistor sizes of the low-power bandgap voltage reference generator.

7. A system to provide a low-power or a low-noise clock signal, comprising:
a crystal oscillator configured to provide an input clock signal;
a low-power limiter configured to receive the input clock signal and configured to limit the input clock signal and generate a low-power output clock signal;
a low-noise limiter coupled to the crystal oscillator and configured to limit the input clock signal and generate a low-noise output clock signal; and
a switch coupled to the low-power output clock signal and the low-noise output clock signal and configured to select either the low-noise output clock signal or the low-power output clock signal to be an output clock signal.

8. The system of claim 7, further comprising:
a control unit configured to provide a control signal to the switch to select the low-noise output clock signal for low-noise mode of operation and to select the low-power output clock signal for low-power mode of operation.

9. The system of claim 8, wherein the control unit is configured to generate a signal to power down the low-noise limiter if the low-power output clock signal is selected and to power down the low-power limiter if the low-noise output clock signal is selected.

10. The system of claim 7, wherein the low-power limiter is configured to limit the clock signal input using a low bias current resulting in the low-power output clock signal.

11. The system of claim 7, wherein the low-noise limiter is configured to limit the clock signal input using a high bias current resulting in a low-noise output clock signal.

12. The system of claim 7, wherein a bias current of the low-power limiter is smaller than a bias current of the low-noise limiter.

13. The system of claim 7, wherein a size of transistors of the low-power limiter is smaller than a size of transistors of the low-noise limiter.

14. The system of claim 7, wherein the switch is a mux.

15. A system to provide a clock signal, comprising:
a low-dropout voltage regulator (LDO);
a low-power bandgap voltage reference generator coupled to the low-dropout regulator and configured to provide a low-power voltage reference to the LDO;
a low-noise bandgap voltage reference coupled to the low-dropout regulator and configured to provide a low-noise voltage reference to the LDO;
a first switch configured to switch a voltage reference input of the LDO to the low-noise bandgap voltage reference or to the low-power bandgap voltage reference;
a crystal oscillator coupled to the LDO and configured to provide an input clock signal;
a low-power limiter circuit coupled to the input clock signal and configured to generate a low-power output clock signal;
a low-noise limiter circuit coupled to the input clock signal and configured to generate a low-noise output clock signal; and
a second switch configured to select the low-noise output clock signal or the low-power output clock signal.

16. The system of claim 15, further comprising:
at least one control unit configured to provide a control signal to switch the voltage reference input of the LDO to the low-noise bandgap voltage reference and select the low-noise output clock signal for low-noise mode of operation and to switch the voltage reference input of the LDO to the low-power bandgap voltage reference and select the low-power output clock signal for low-power mode of operation.

17. A method to provide a low-power clock signal or a low-noise clock signal, comprising:
determining whether a low-power mode of operation or a low-noise mode of operation is in use;
switching a voltage reference input of a low-dropout voltage regulator (LDO) to a low-power voltage reference or to a low-noise voltage reference;
providing a constant voltage output using the LDO to a crystal oscillator;
generating an input clock signal using the crystal oscillator;
limiting the input clock signal using a low-power limiter to generate a low-power output clock signal or limiting the clock signal using a low-noise limiter to generate a low-noise output clock signal; and
selecting the low-power output clock signal or the low-noise output clock signal.

18. The method of claim 17, further comprising:
powering down the low-power bandgap voltage reference generator and the low-power limiter upon switching to the low-noise voltage reference and upon selecting the low-noise output clock signal; and
powering down the low-noise bandgap voltage reference generator and the low-noise limiter upon switching to the low-power voltage reference and upon selecting the low-power output clock signal.

19. A non-transitory tangible computer-readable medium having stored thereon, computer-executable instructions that, if executed by a computing device, cause the computing device to:
   determine whether a low-power mode of operation or a low-noise mode of operation is in use;
   generate a first control signal to switch a voltage reference input of a low-dropout voltage regulator (LDO) to a low-power voltage reference or to a low-noise voltage reference based on whether said low-power mode of operation or said low-noise mode of operation is in use; and
   generate a second control signal to select a low-power output clock signal from a low-power limiter or a low-noise output clock signal from a low-noise limiter based on whether said low-power mode of operation or said low-noise mode of operation is in use.

20. The non-transitory tangible computer-readable medium of claim 19, further comprising computer-executable instructions that, if executed by a computing device, cause the computing device to:
   generate a third control signal to power-down the low-power bandgap voltage reference generator and a fourth control signal to power-down a low-power limiter upon selecting the low-noise voltage reference and the low-noise output clock signal; and
   generate a fifth control signal to power-down the low-noise bandgap voltage reference generator and a sixth control signal to power-down a low-noise limiter upon selecting the low-power voltage reference and the low-power output clock signal.

* * * * *